United States Patent
Peake et al.

(10) Patent No.: US 6,534,367 B2
(45) Date of Patent: Mar. 18, 2003

(54) TRENCH-GATE SEMICONDUCTOR DEVICES AND THEIR MANUFACTURE

(75) Inventors: Steven T. Peake, Warrington (GB); Georgios Petkos, Stockport (GB); Robert J. Farr, Halifax (GB); Christopher M. Rogers, Burnage (GB); Raymond J. Grover, Didsbury (GB); Peter J. Forbes, Hazel Grove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/134,213

(22) Filed: Apr. 26, 2002

(65) Prior Publication Data

US 2002/0160573 A1 Oct. 31, 2002

(30) Foreign Application Priority Data

Apr. 28, 2001 (GB) .............................................. 0110459
Dec. 14, 2001 (GB) .............................................. 0129887

(51) Int. Cl.$^7$ ............................................ H01L 21/336
(52) U.S. Cl. ........................ 438/270; 438/212; 438/259; 438/589; 438/700
(58) Field of Search ................................ 438/135, 137, 438/138, 212, 259, 268, 270, 589, 700, 209, 961, 963, FOR 192, FOR 176

(56) References Cited

U.S. PATENT DOCUMENTS

| | | | |
|---|---|---|---|
| 5,283,201 A | * | 2/1994 | Tsang et al. |
| 5,366,914 A | * | 11/1994 | Takahashi et al. |
| 5,907,776 A | * | 5/1999 | Hshieh et al. |
| 5,972,741 A | * | 10/1999 | Kubo et al. |
| 6,051,469 A | * | 4/2000 | Sheu et al. |
| 6,087,224 A | | 7/2000 | Luo ............................ 438/270 |
| 6,190,971 B1 | * | 2/2001 | Gruening et al. |
| 6,211,018 B1 | | 4/2001 | Nam et al. ................... 438/270 |
| 6,228,698 B1 | * | 5/2001 | Luo |
| 6,251,730 B1 | * | 6/2001 | Luo |
| 6,252,277 B1 | * | 6/2001 | Chan et al. |
| 6,358,800 B1 | * | 3/2002 | Tseng |
| 6,368,921 B1 | * | 4/2002 | Hijzen et al. |
| 6,429,078 B2 | * | 8/2002 | Kubo |

* cited by examiner

*Primary Examiner*—Olik Chaudhuri
*Assistant Examiner*—Joannie Adelle Garcia
(74) *Attorney, Agent, or Firm*—Steven R. Biren

(57) ABSTRACT

Compact trench-gate semiconductor devices, for example a cellular power MOSFET with sub-micron pitch (Yc), are manufactured with self-aligned techniques that use sidewall spacers (52) in different ways. The trench-gate (11) is accommodated in a narrow trench (20) that is etched via a narrow window (52b) defined by the spacers (52) at sidewalls of a wider window (51a) of a mask (51) at the body surface (10a). The spacers (52) permit a source region (13) adjacent to the trench-gate (11) and an insulating overlayer (18) over the trench-gate (11) to be self-aligned to this narrow trench (20). The overlayer (18), which defines a contact window (18a) for a source electrode (33), is provided in a simple but reproducible manner by deposition and etch-back, after removing the spacers (52). Its overlap (y4, y4') with the body surface (10a) is well-defined, so reducing a short-circuit risk between the source electrode (33) and the trench-gate (11). Furthermore, implantation of the source region (13) is facilitated, and a channel-accommodating region (15) can also be provided using a high energy implant (61) after providing the insulating overlayer (18).

18 Claims, 10 Drawing Sheets

TRENCH-GATE SEMICONDUCTOR DEVICES AND THEIR MANUFACTURE

This invention relates to trench-gate semiconductor devices, for example power MOSFETs (insulated-gate field-effect transistors), and to their manufacture using self-aligned techniques to fabricate the devices with compact geometries.

Trench-gate semiconductor devices are known, having a trench-gate in a trench that extends from a source region through a channel-accommodating region to a drain region of the first conductivity type. United States patent specification U.S. Pat. No. 6,087,224 (our reference PHB34245) discloses an advantageous method of manufacturing such trench-gate semiconductor devices, wherein:

(a) a narrow window is defined by providing sidewall extensions at the sidewalls of a wider window in a first mask at a surface of a semiconductor body, (b) a trench is etched into the body at the narrow window, and the gate is provided in the trench, (c) the source region is provided so as to be self-aligned with the trench-gate by means of the sidewall extensions, and (d) an insulating overlayer is provided over the trench-gate.

This method permits the use of self-aligned masking techniques in a flexible device process with good reproducibility. In particular, by using the sidewall extensions in different stages, narrow trench-gates can be formed and the source region and a contact window for a source electrode can be determined in a self-aligned manner with respect to this narrow trench. The whole contents of U.S. Pat. No. 6,087,224 are hereby incorporated herein as reference material.

U.S. Pat. No. 6,087,224 discloses various forms of the method. Thus, for example, the source region and/or channel-accommodating region may be provided either before or after forming the trench-gate, either a deep or shallow more highly-doped region may be provided (also in a self-aligned manner) in the channel-accommodating region, either a doped-semiconductor or a metal or silicide material may be used for the gate, and either an oxidized or deposited insulating overlayer may be provided (also in a self-aligned manner) over the trench-gate. In the detailed embodiments described, the insulating overlayer is provided in the presence of the sidewall extensions and is constrained by these sidewall extensions. Furthermore, when the sidewall extensions are removed to form doping windows for forming the source region, the doping is constrained by the simultaneous presence of both the first mask part and the previously-provided overlayer over the trench-gate, It is an aim of the present invention to provide a modification of such a method, involving a novel sequence of process steps that can simplify and improve the provision of the insulating overlayer and that can provide other advantageous device features in relation thereto.

According to the present invention, there is provided such a method of manufacturing a trench-gate semiconductor device, for example an insulated-gate field-effect device, wherein:

(a) a narrow window is defined by providing sidewall extensions at the sidewalls of a wider window in a first mask at a surface of a semiconductor body, (b) a trench is etched into the body at the narrow window, and the gate is provided in the trench, (c) the source region is provided so as to adjoin a sidewall of the trench (and is preferably self-aligned with the trench-gate by means of the sidewall extensions), and (d) an insulating overlayer is provided over the trench-gate using the following sequence of steps:
  removing the sidewall extensions to leave at least a part of the first mask with the wider window at the surface of the body,
  depositing insulating material to a thickness that is sufficient to fill the wider window and to extend above the wider window and over the first mask part,
  etching back the insulating material to leave the insulating overlayer in the wider window in the first mask part,
  and then removing the first mask part before providing a source electrode to contact the source region and an adjacent surface region of the body and to extend over the insulating overlayer over the trench-gate.

The present inventors find that (after etching the trench and providing the trench-gate) the edge quality of the wider window in the first mask part is better than that of the sidewall extensions and that its re-exposure (by removing the sidewall extensions) permits the insulating overlayer to be provided in a reproducible manner by a simple deposition and etch-back process that fills this wider window. Thus, whereas the edge of the sidewall extensions is typically tapered and possibly irregular in etch-back, the first mask part can have a well-defined vertical edge. The profile of this well-defined vertical edge can be reproducibly transferred, in accordance with the invention, to the edge of the contact window formed in the insulating overlayer by removal of the first mask part. The resulting edge of the insulating overlayer can be used in various ways, as described hereinafter. Furthermore, the formation of the insulating overlayer is not constrained by the presence of the sidewall extensions, because these sidewall extensions have been removed.

Because the insulating overlayer is formed filling the wider window of the first mask part, it extends a well-defined lateral distance onto the adjacent body surface from over the trench-gate. As such, there is a well-defined, reproduceable spacing between the sidewall of the trench and the edge of the contact window that is formed in the insulating overlayer by removal of the first mask part. This well-defined, reproduceable spacing provides a good safeguard against short-circuiting of the source electrode to the trench-gate at the edge of the contact window. Furthermore, the resulting insulating overlayer can readily be formed over a slightly sunken trench-gate such that it also extends inside an upper part of the gate trench. In this way, reliable insulation can be provided over the top corner of the gate trench to avoid short-circuits.

Furthermore, the process sequence in accordance with the invention opens up opportunities for providing the source region doping at stages in which the doping process is not constrained by the simultaneous presence of both the first mask part and the previously-provided overlayer over the trench-gate.

Thus, the source region is advantageously provided using the following sequence of steps before depositing the insulating material for the insulating overlayer:
  removing the sidewall extensions to leave at least a part of the first mask with the wider window at the surface of the body and to form within the wider window a doping window between the first mask part and the trench-gate, and
  introducing dopant of a first conductivity type into the body via the wider window (that includes this doping window) so as to form the source region adjacent to the trench-gate.

Other alternative process sequences are also possible for providing the source region (or at least its doping) before depositing the insulating material for the insulating overlayer. Thus, the source region may be implanted at the wider widow in the first mask part before providing the sidewall extensions, or its doping may be implanted as a layer at the body surface before providing the first mask. However, in both these cases the trench is then etched through the source region doping, which is less advantageous (as described below).

Depending on how other features of the device are formed, the full extent of the insulating overlayer defined by the filling of the wider window may be retained in the manufactured device. However, it may be modified in subsequent processing. Thus, for example, after removing the first mask part in stage (d) and before providing the source electrode, the insulating material of the insulating overlayer may be isotropically etched back a sufficient distance to increase the area of the source region not covered by the insulating overlayer.

Methods in accordance with the present invention are particularly beneficial for manufacturing compact cellular devices, such as power MOSFETs. Thus, the first mask and its associated windows may have a layout geometry that defines device cells with a cell pitch of about 1 micrometer or less.

Preferably the channel-accommodating region is provided after the trench-gate, whereby high temperature processes that may be used to form the trench-gate structure (such as, for example, thermal oxidation to form a high-quality gate dielectric) do not affect the subsequently provided doping profile of the channel-accommodating region. The sidewall extensions may be used in a variety of ways to self-align the source region with the trench-gate. Preferably the source doping profile is provided after forming the trench-gate structure so as not to be affected thereby. A simple and convenient way to form the source region is to introduce its doping concentration of the first conductivity type into the body via the window formed by removing the sidewall extensions in stage (d).

Thus, in a convenient and preferred method in accordance with the invention, the trench is etched in stage (b) through a silicon body portion having a doping concentration of the first conductivity type that extends from the surface into an underlying area to provide a part of the drain region. In the case of an insulated-gate device, the gate dielectric may be formed by depositing an insulating layer on the walls of the trench. However, the gate dielectric layer may be formed by thermal oxidation of the silicon body portion at the walls of the trench. Thus, these earlier steps for forming the trench-gate structure do not disturb the subsequently-provided doping profiles of the source region and channel-accommodating region. Furthermore, the etching of the trench and thermal oxidation at its walls to form a high quality gate dielectric can be carried out in a homogeneous body portion, unaffected by the (subsequently-provided) source and channel region doping concentrations.

The doping profile of the channel-accommodating region may be provided after providing the insulating overlayer in step (d). The lateral extent of the overlayer over the body surface adjacent to the trench-gate is sufficiently small (as determined by the sidewall extensions) that the dopant provision for the channel-accommodating region can extend laterally thereunder to the trench. In some embodiments, thermal diffusion may be used for the dopant provision. However, a high energy implant with a simple activation anneal can be most advantageous in giving precise control. This implantation can be carried out at a sufficiently high energy and in a sufficiently high dose that the dopant ions implanted at the window in the overlayer are scattered laterally under the overlayer to reach the sidewall of the trench. The ion energy may be so high that the dopant ions even penetrate through the overlayer and are implanted in this underlying portion of the body adjacent to the trench.

These and other features in accordance with the present invention are illustrated in embodiments of the invention that are now described, by way of example, with reference to the accompanying drawings, in which.

Figure 9:
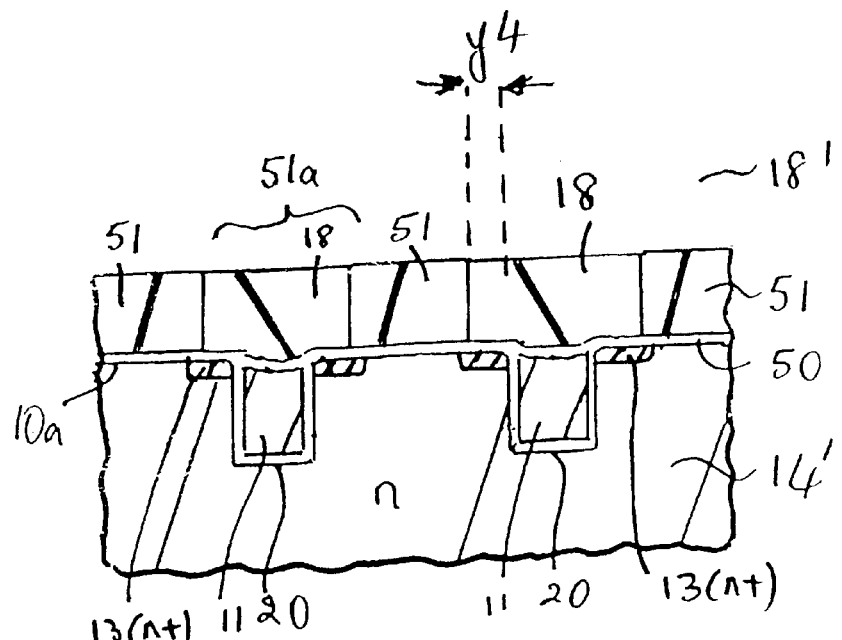
Figure 10:
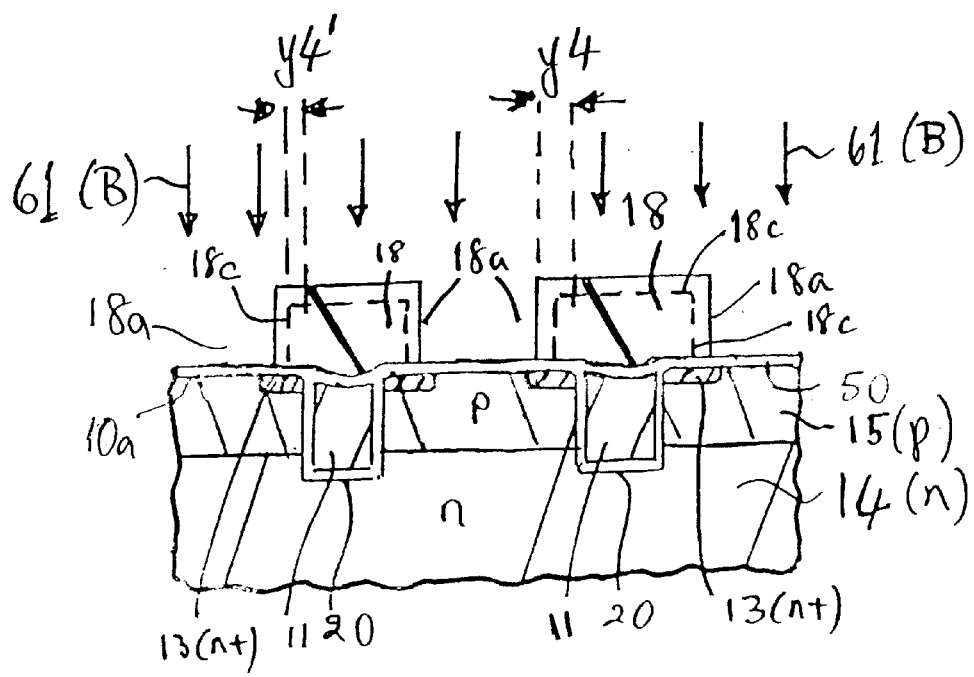
Figure 16:
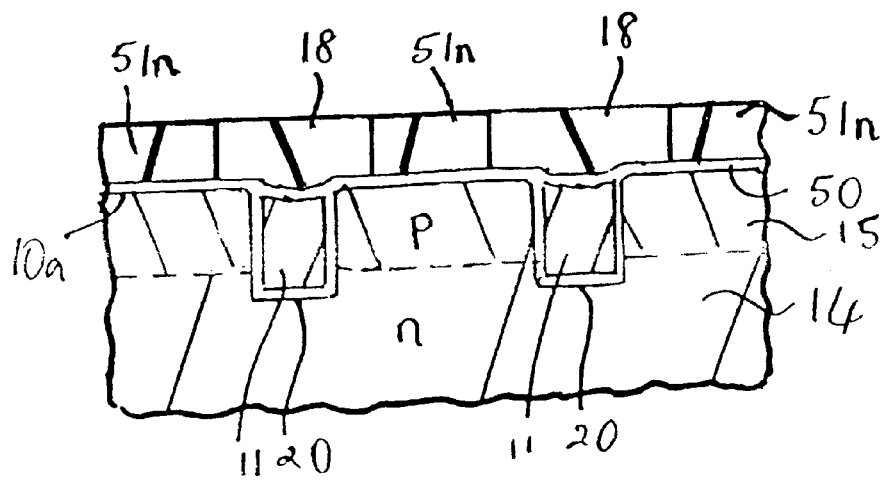
Figure 17:
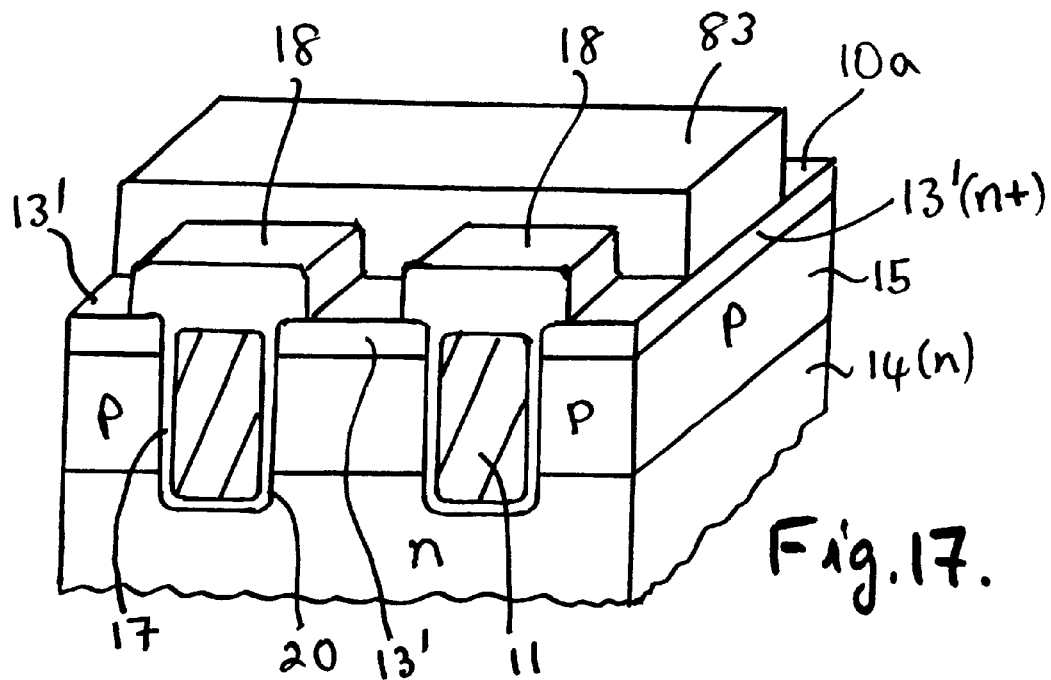
Figure 18:
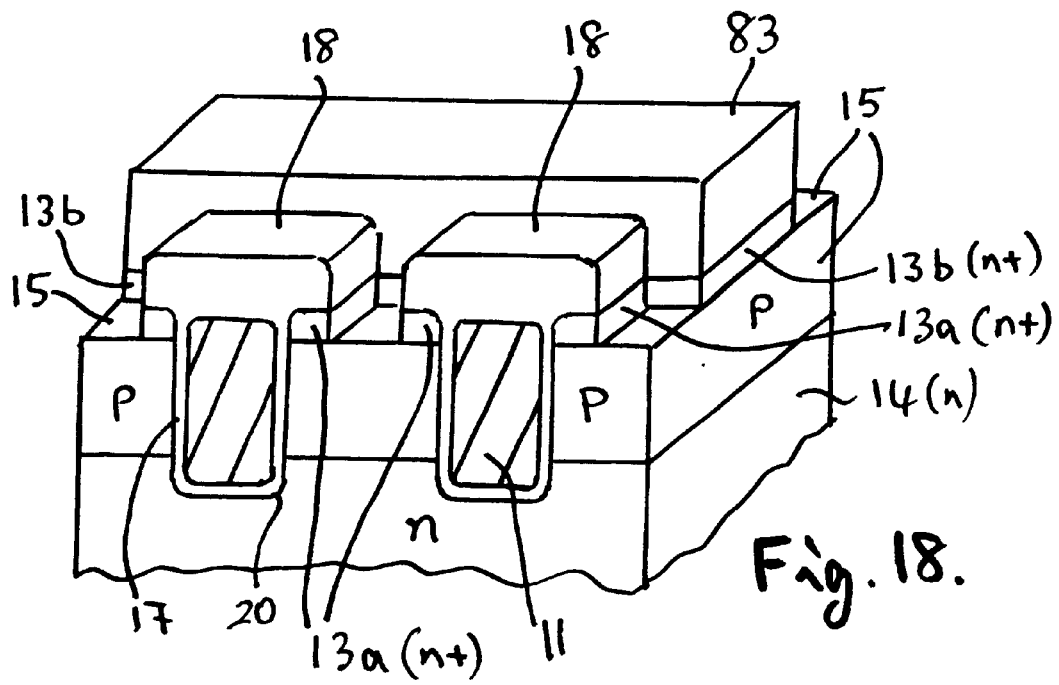
Figure 19:
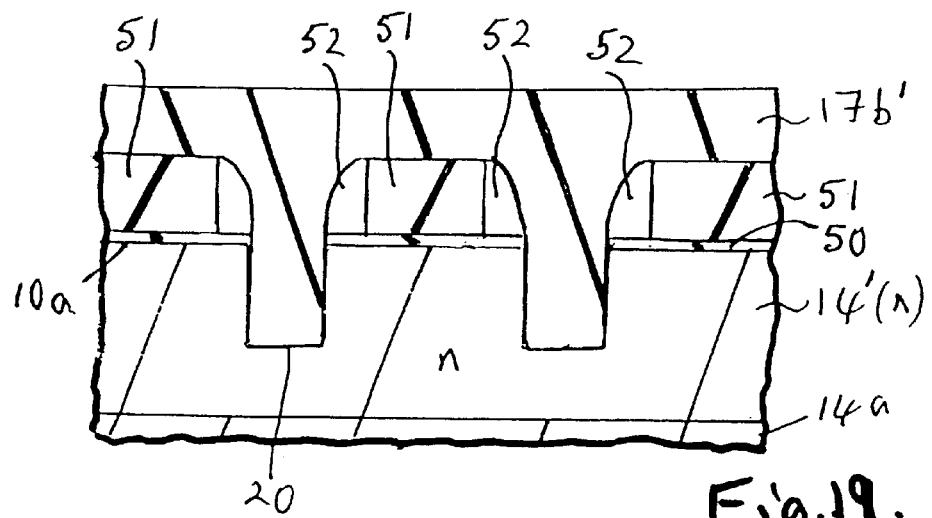
Figure 20:
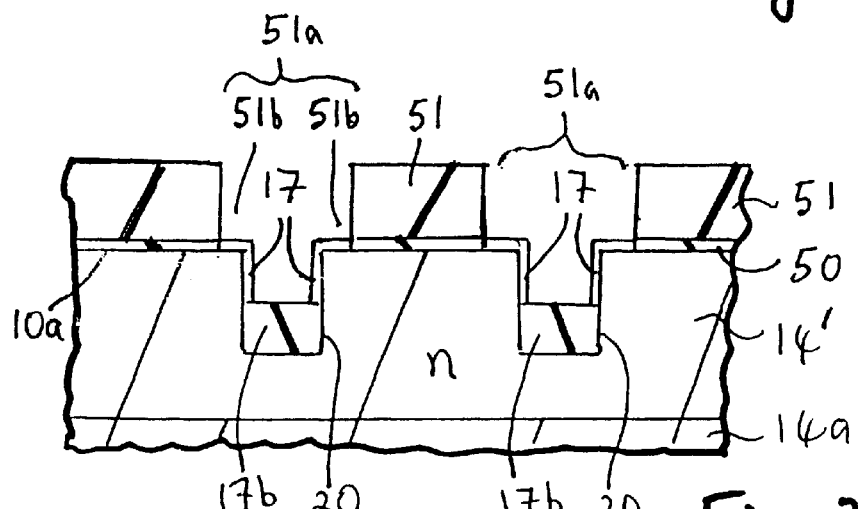
Figure 21:
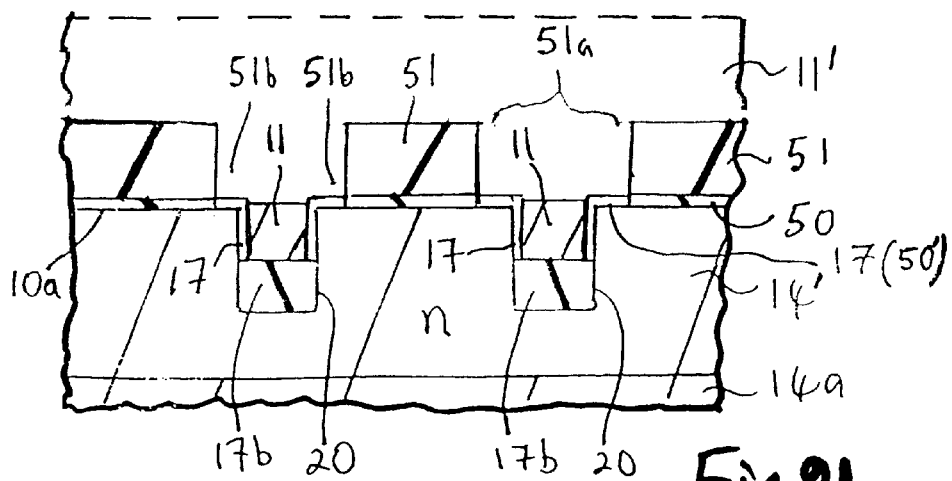

FIGS. 17 and 18 are partial perspective views of a cross section similar to that of FIG. 10, but illustrating a modification in the provision of the source region; and FIGS. 19 to 21 are cross-sectional views of an active central part of a further example of a trench-gate semiconductor device at successive stages in its manufacture by a further example of a method in accordance with the invention; and It should be noted that FIGS. 1 to 21 are diagrammatic, with the relative dimensions and proportions of various parts of these drawings being shown exaggerated or reduced in size, for the sake of clarity and convenience in the drawings. The same reference signs are generally used to refer to corresponding or similar features in modified and different embodiments.

Figure 1:
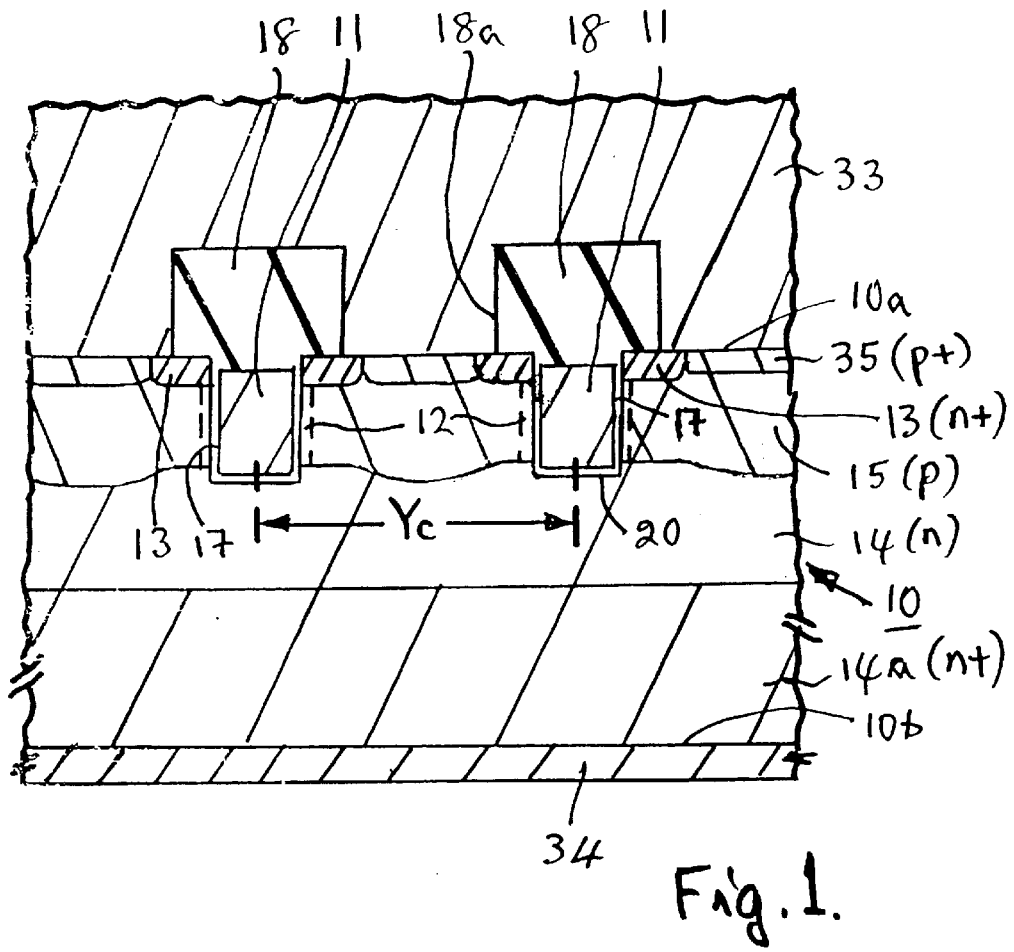
FIG. 1 is a cross-sectional view of an active central part of one example of a trench-gate semiconductor device manufactured in accordance with the invention.

FIG. 1 illustrates an exemplary embodiment of a cellular power MOSFET device having an insulated trench-gate 11. In the transistor cell areas of this device, a channel-accommodating region 15 of a second conductivity type (i.e. p-type in this example) separates source and drain regions 13 and 14, respectively, of a first conductivity type (n-type in this example). The drain region 14 is common to all the cells. The gate 11 is present in a trench 20 that extends through the regions 13 and 15 into an underlying portion of the drain region 14. The gate 11 is capacitively coupled to the channel-accommodating region 15 by an intermediate dielectric layer 17 at the walls of the trench 20. The application of a voltage signal to the gate 11 in the on-state of the device serves in known manner for inducing a conduction channel 12 in the region 15 and for controlling current flow in this conduction channel 12 between the source and drain regions 13 and 14.

The source region 13 is located adjacent to the top major surface 10a of the device body 10, where regions 13 and 15 are contacted by a source electrode 33. The trench-gate 11 is insulated from the overlying electrode 33 by an intermediate insulating overlayer 18. FIG. 1 shows a vertical power device structure. The region 14 is a drain-drift region, which may be formed by an epitaxial layer of high resistivity on a more highly-doped substrate 14a of the same conductivity type. This substrate 14a is contacted at the bottom major surface 10b of the device body 10 by a drain electrode 34.

Typically the device body 10 is of monocrystalline silicon, and the gate 11 is typically of conductively-doped polycrystalline silicon. Typically, the intermediate gate dielectric layer 17 is of thermally grown silicon dioxide or deposited silicon dioxide.

The device of FIG. 1 is manufactured with self-aligned features by a method in accordance with the present invention, which includes the following stages:

(a) a narrow window 52a is defined (FIG. 4), by providing sidewall extensions 52 (commonly termed "spacers" 52) at the sidewalls of a wider window 51a in a first mask 51 (FIG. 3) at the top surface 10a of a semiconductor wafer body 100 (that provides the device body 10), (b) a trench 20 is etched into the body 100 at the narrow window 52a, and the insulated gate 11 is provided in the trench 20 (FIG. 5), (c) the source region 13 is provided (FIG. 7) so as to be self-aligned with the trench-gate 11 by means of the spacers 52, and (d) the insulating overlayer 18 is provided over the trench-gate using the following sequence of steps:

removing the sidewall extensions 52 to leave at least a part 51n of the first mask 51 with the wider window 51a at the surface 10a of the body (FIG. 6), depositing insulating material 18' to a thickness that is sufficient to fill the wider window 51a and to extend above the window 51a and over the first mask part 51,51n (FIG. 8), etching back the insulating material 18' to leave the insulating overlayer 18 in the wider window 51a in the first mask part 51,51n (FIG. 9), and then removing the first mask part 51,51n (FIG. 10) before providing the source electrode 33 (FIG. 12) to contact the source region 13 and an adjacent surface region 13 of the body and to extend over the insulating overlayer 18 over the trench-gate 11.

This permits the insulating overlayer 18 (and its definition of the contact window 18a for the source electrode 33) to be provided in a reproducible manner by a simple deposition and etch-back process that fills the wider window 51a. It is achievable because there is a good quality edge to the window 51a in the first mask part 51,51n, i.e. a more vertical and well-defined edge that is better than the etched-back tapered edge of the spacers 52 after etching the trench and forming the trench-gate 11. Furthermore, the formation of this insulating overlayer 18 is not constrained by the presence of the spacers 52, because these spacers 52 have been removed. Thus, this process is more advantageous that the detailed embodiments disclosed in U.S. Pat. No. 6,087,224.

However, this method does still utilize the spacers 52 in accordance with invention disclosed in U.S. Pat. No. 6,087, 224, for forming a narrow trench-gate 11 and for determining the source region 13 and its contact in a self-aligned manner with respect to the narrow trench 20. Indeed, a single masking pattern 45,51 (which is photo-lithographically defined in FIG. 2) is used for determining, in a self-aligned manner, all subsequent windows (for etching, planarization, doping, contacting, etc.) in the cell areas shown in FIGS. 1 to 12. This self-alignment simplifies the manufacture and permits a reproducible close spacing of the transistor cells, for example, with a cell pitch Yc of about 1 micrometer or less.

However, additional improvements and advantages are obtained in accordance with the present invention by forming the insulating overlayer 18 in the window 51a of the first mask part 51,51n. Thus, the overlayer 18 extends a well-defined lateral distance y4 (FIGS. 9 and 10) onto the adjacent body surface 10a from over the trench-gate 11. As such, there is a well-defined, reproduceable spacing y4 or y4' between the sidewall of the trench 20 and the edge of the contact window 18a. This well-defined, reproduceable spacing y4 or y4' provides a good safeguard against short-circuiting of the source electrode 33 to the trench-gate 11 at the edge of the contact window 18a. A further safeguard against short-circuits can be achieved by adopting a cap and plug configuration for the insulating overlayer as described below with reference to FIG. 13.

Furthermore, the process sequence in accordance with the invention opens up opportunities for providing the source region doping 63 at stages in which this doping process is not constrained by any simultaneous presence of the first mask part 51 and the overlayer 18. Thus, for example, the source region 13 may be advantageously provided at the FIG. 7 stage, as described below.

The doping profile of the channel-accommodating region 15 adjacent to the insulated trench-gate 11 is important in determining the gate-controlled characteristics of the channel 12. It may be provided after the insulating overlayer 18, preferably using a high-energy dopant-ion implant, as illustrated by the arrows 61 in FIG. 10. This is achievable because of the good reproducibility of the edge and lateral extent y4 of the overlayer 18 above the channel area. As described in due course, this doping process also is very well suited for closely spaced cells, for example, with a cell pitch Yc of about 1 micrometer or less.

Figure 2:
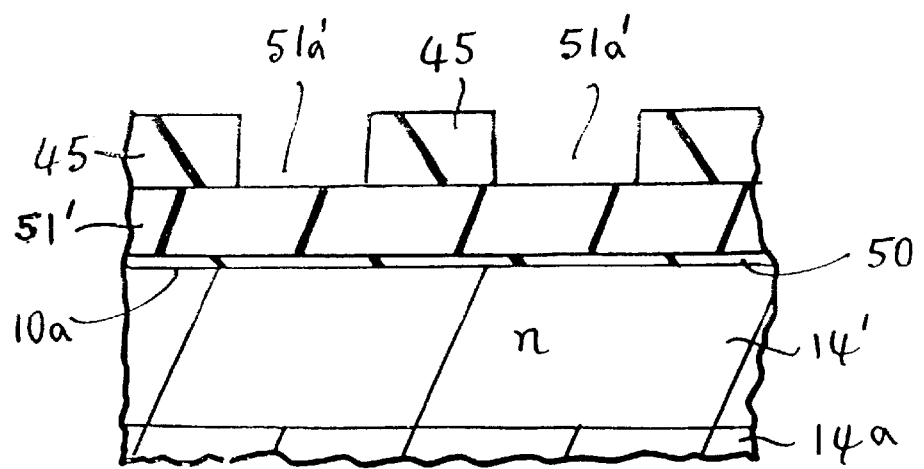
FIGS. 2 to 12 are cross-sectional views of the part of FIG. 1 at successive stages in its manufacture by one example of a method in accordance with the invention.
Figure 3:
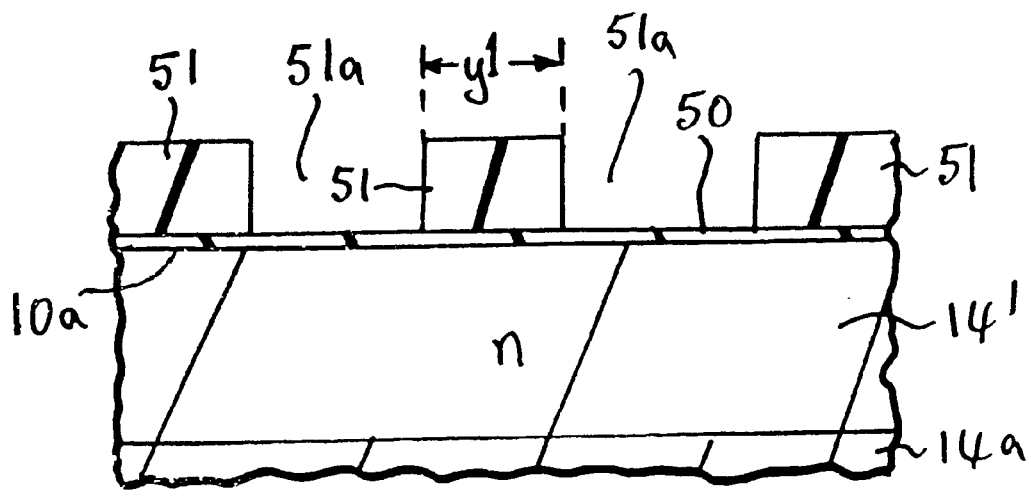

The cell pitch and the layout geometry of the device is determined by the photolithographic and etching stage illustrated in FIGS. 2 and 3. No plan view of the cellular layout geometry is shown in the drawings, because the method of FIGS. 1 to 12 may be used for quite different, known cell geometries. Thus, for example the cells may have a square geometry or a close-packed hexagonal geometry, or they may have an elongate stripe geometry. In each case, the trench 20 (with its gate 11) extends around the boundary of each cell. FIG. 1 shows only a few cells, but typically the device comprises many thousands of these parallel cells between the electrodes 33 and 34. The active cellular area of the device may be bounded around the periphery of the device body 10 by various known peripheral termination schemes (also not shown). Such schemes normally include the formation of a thick field-oxide layer in the peripheral device area at the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells will now be described with reference to the sequence of FIGS. 2 to 12, by way of example of a specific embodiment.

FIG. 2 illustrates the body part of FIG. 1 at an early stage in the device manufacture. In this specific embodiment, a thick silicon nitride layer 51'0 is deposited on a thin silicon dioxide layer 50 on the silicon body surface 10a.

Figure 4:
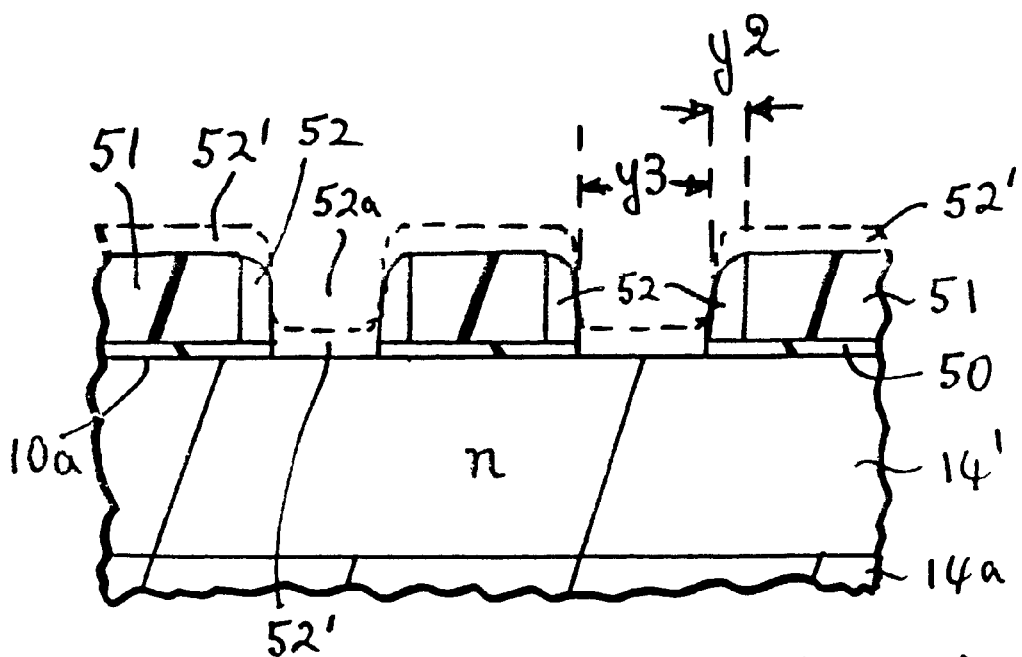
Figure 7:
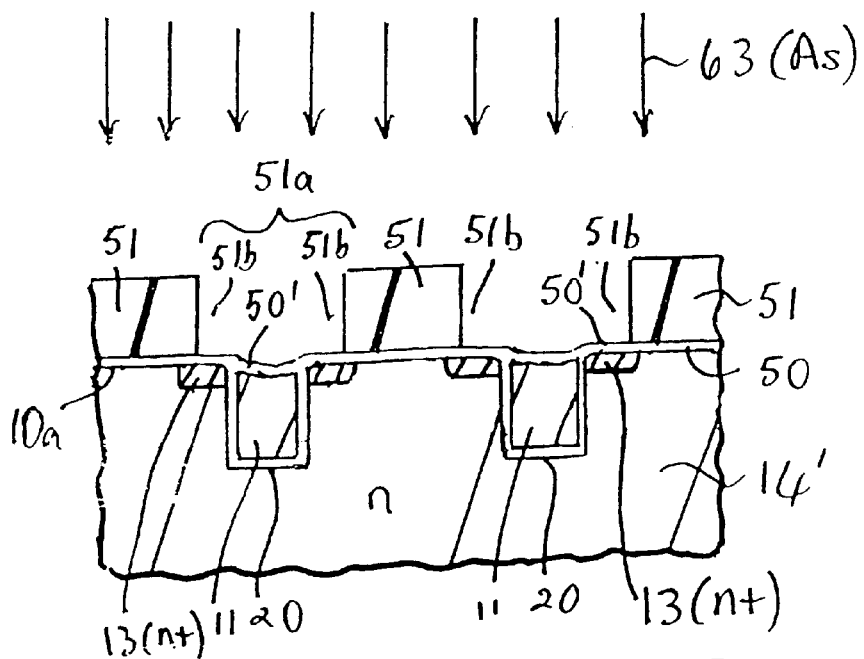

Typically the oxide layer 50 may be 30 nm to 50 nm thick. The thickness of the nitride layer 51' in this embodiment of FIGS. 1 to 12 is chosen in accordance with:

the desired depth & width proportions of the window 51a for formation of the spacers 52 in FIG. 4, its desired penetration by dopant ions 61 in the high-energy implant stage of FIG. 10, while masking the lower energy ions 63 of the FIG. 7 implant, and the desired thickness of the insulating overlayer 18 formed in the FIG. 9 planarization stage.

In a particular device embodiment, by way of a specific example, the nitride layer 51' may be in the range of 0.4 μm to 0.5 μm thick, and window 51a may be about 0.5 μm wide.

The window 51a is defined using known photolithographic techniques. A photoresist mask 45 with a corresponding window 51a' is provided on the nitride layer 51' as illustrated in FIG. 2. This serves as an etchant mask for etching the window 51a into the layer 51' to form the mask 51 illustrated in FIG. 3. This mask 51 and its associated windows (51a of FIG. 3 and narrowed window 52a of FIG. 4) have a layout geometry that defines the layout of the device cells and their pitch Yc.

Thus, the windows 51a & 52a define the gate boundary of the cells which is, for example, an hexagonal network in the case of a close-packaged hexagonal cellular geometry. In whatever layout geometry is chosen for the embodiment of FIGS. 1 to 12, the width y1 of the mask 51 between neighbouring windows 51a is chosen in accordance with the desired contact area of contact window 18a for the electrode 33.

In this specific embodiment, an oxide layer 52' is now contour deposited on the top and sidewalls of the nitride mask 51 and at the bottom of the window 51a. This oxide layer 52' is then etched back in known manner, using a directional etch, to remove it from the top of the nitride mask 51 and from the bottom of the window 51a, while leaving the spacers 52 at the sidewalls. The etch-back also removes the exposed thin oxide layer 50 from the window 52a. Typically, the contour-deposited oxide layer 52' may be about 0.2 μm thick, so that the remaining width y2 of spacers 52 is in the range of 0.1 μm to 0.2 μm. FIG. 4 shows the resulting structure, with the narrower window 52a of width y3 as defined by the spacers 52 of width y2.

The trench 20 is now etched into the body 100 at the window 52a. As shown in FIGS. 2 to 5, the silicon body portion 14' into which the trench 20 is etched may have a doping concentration n of the same conductivity type from the surface 10a into the area that provides a part of the drain region 14, i.e. the drain drift region. This doping concentration n may be substantially homogeneous, for example about $2 \times 10^{16}$ or $3 \times 10^{16}$ phosphorus or arsenic atoms cm$^{-3}$. Alternatively, it may be graded from less than $5 \times 10^{16}$ (e.g. $1 \times 10^{16}$) phosphorus or arsenic atoms cm$^{-3}$ at the surface 10a to more than 10 times greater (e.g. $3 \times 10^{17}$ phosphorus or arsenic atoms cm$^{-3}$) at the interface with substrate 14a, as disclosed in U.S. Pat. No. 5,612,567.

In a specific embodiment, the depth to which the trench 20 is etched may be, for example, about 1.5 μm. This is three times the thickness of the mask 51 and so illustrates the extent to which the drawing proportions are distorted for convenience in these diagrammatic Figures.

A gate dielectric layer 17 is then formed, for example by thermal oxidation of the silicon body portion 14' at the walls of the trench 20. In the embodiment of FIGS. 1 to 11, this dielectric layer 17 lines the bottom as well as the sidewalls of the trench 20. Thereafter, the gate 11 is provided in known manner, by depositing gate material 11' to a thickness that is sufficient to fill the trench 20 and to extend above the window 52a and over the mask 51,52, and then etching back the gate material 11' to leave it forming the trench-gate 11. Typically, the gate 11 may comprise doped polycrystalline silicon or other semiconductor material. Its doping concentration may be provided while the material 11' is being deposited or after deposition, for example at the etch-back stage illustrated in FIG. 5. In this embodiment, this gate doping concentration is of the first conductivity type (n-type in this example), and it is of greater magnitude than the doping concentration of the second conductivity type introduced in the FIG. 10 stage for the channel-accommodating region 15.

Figure 6:
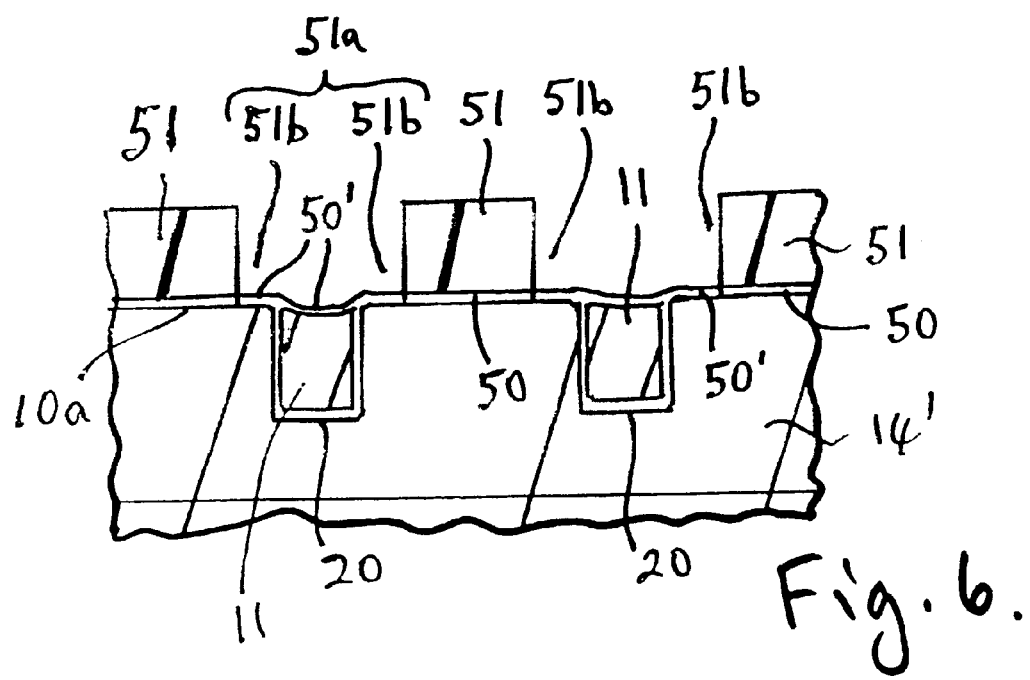

The oxide spacers 52 are now etched away to re-open the window 51a and so to form a doping window 51b between the mask 51 and the trench-gate 11. This etch also removes the thin oxide 50 under the oxide spacers 52. As the window 51b is to be used for implantation, a thin oxide 50' is now regrown in this window 51a on the exposed area of the silicon body surface 10a (and also grows on the exposed silicon gate 11). The resulting structure is shown in FIG. 6.

As illustrated in FIG. 7, the doping concentration n+ of the source region 13 is now introduced into the body 100 via the doping window 51b. The nitride layer 51 acts as a mask. This source doping is preferably carried out by implantation of arsenic ions 63. Typically, a very high dose is used to provide a doping concentration of $10^{20}$ to $10^{22}$ arsenic atoms cm$^{-3}$. The ion energy is typically about 30 keV. At this dose and energy, the arsenic ions are scattered below the edge of the mask 51. After one or more anneals, for example an anneal at 900° C. for 1 hour, the source region 13 typically extends laterally about 0.1 μm to 0.2 μm beyond the window edge line of the mask 51.

Figure 8:
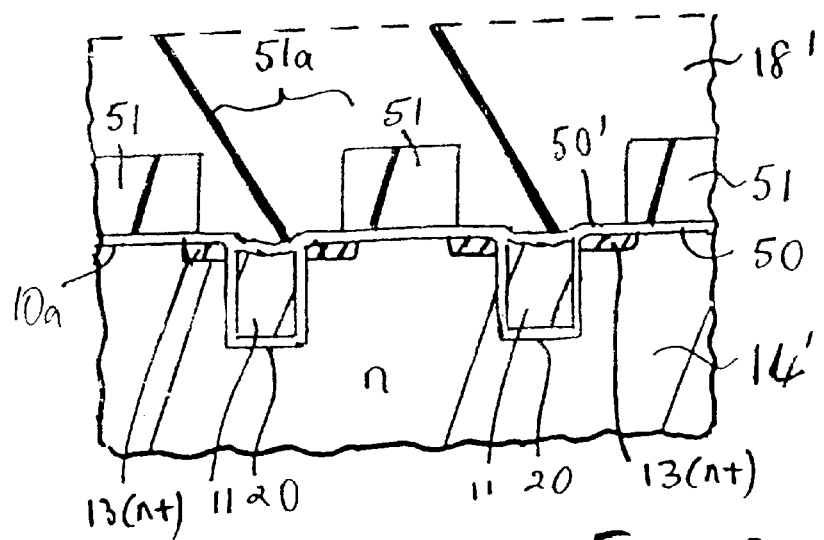

As illustrated in FIGS. 8 and 9, the insulating overlayer 18 is now provided over the trench-gate 11 in the wider window 51a of the first mask 51. This is achieved in accordance with the present invention, in what may be termed a planarization process. Insulating material 18' (for example, silicon dioxide) is deposited to a thickness that is sufficient to fill the window 51a and to extend above window 51a and over the mask 51. Then the insulating material 18' is etched back to leave it over the trench-gate 11 and over the body surface 10a in what was the doping window 51b. The thickness of the resulting overlayer 18 is at most corresponding to the thickness of the mask 51 at this stage of the manufacture. In a specific example, the overlayer 18 may be between 0.3 μm and 0.4 μm thick. The lateral extent y4 of its overlap with the silicon body surface 10a is reproducibly determined by the width y2 of the spacers.

The mask 51 is then removed to form the window 18a in the insulating overlayer 18, as illustrated in FIG. 10. As determined by its lateral extent below the mask 51, the source region 13 extends laterally into this window 18a. This lateral extent may be sufficient for a good low-resistance contact to the source electrode 33, particularly after the implant anneals of FIGS. 10 and 11. However, the overlayer 18 of FIG. 10 may be isotropically etched back a sufficient distance to reduce the overlap (from y4 to y4') and so to increase the area of the source region 13 not covered by the layer 18. This further etch-back is illustrated by broken lines 18c in FIG. 10 and its implications are discussed below with reference to FIG. 11.

The high-energy dopant-ion implant illustrated in FIG. 10 is now carried out to provide the channel-accommodating region 15. Dopant ions 61 are implanted at a sufficiently high energy and in a sufficiently high dose that those dopant ions 61 that are implanted at the window 18a are scattered laterally below the part of the overlayer 18 on the body surface 10a. The ion energy may even be sufficiently high that those dopant ions that impinge on the overlayer 18 penetrate there-through so as to be implanted in the underlying portion of the body 100. Typically, the dopant ions may be of boron having an implantation energy in excess of 200 keV. In the event that the overlayer 18 does not fully mask the trench-gate 11 against this implantation, the boron doping concentration is insufficient to over-dope that of the polycrystalline silicon gate material.

The inventors find that, for example, a dose of $2 \times 10^{13}$ cm$^{-2}$ boron ions at an ion energy of 260 keV implanted at the window 18a are scattered laterally by more than 0.4 µm below a mask edge. Such scattering can provide the desired boron doping concentration adjacent to the trench 20, i.e. laterally under a 0.15 µm or 0.2 µm wide extension (y4 or y4') of the overlayer 18 on the body surface 10a. Furthermore, with this high energy, the dopant ions 61 can penetrate through the thickness (for example, 0.3 µm to 0.4 µm) of the overlayer 18 to enhance this doping concentration adjacent to the trench 20. Typically, this doping concentration may be, for example, about $10^{17}$ boron atoms cm$^{-3}$. This doping concentration of the region 15 adjacent to the trench 20 can be reproducibly determined, because a precisely-defined and reproducible thickness, lateral extent and edge to the overlayer 18 can be produced using the above-described method in accordance with the present invention. A heating step, for example 1,100° C. for 40 minutes, is then carried out in order to anneal the implantation damage and activate the dopant. Some thermal diffusion of the implanted dopant occurs during this heating step, which also contributes to achieving homogeneity in the doping concentration of the region 15.

Figure 11:
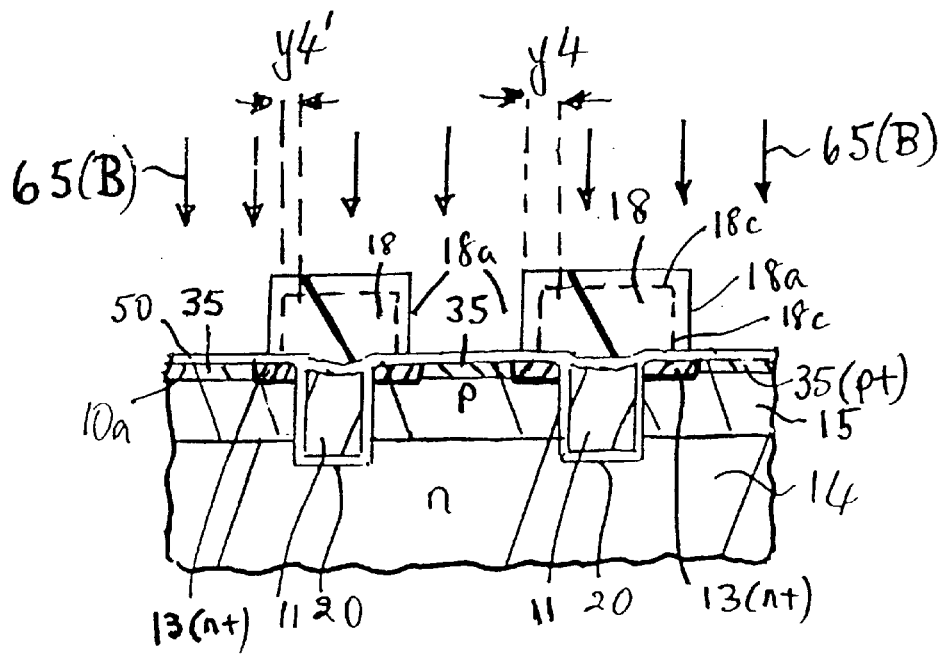

After so providing the channel-accommodating region 15 via the contact window 18a, additional dopant of the second conductivity type (i.e. p-type) is introduced into the body 100 (also via the contact window 18a) so as to form a more highly doped contact region 35 for the channel-accommodating region 15. This is preferably achieved by implanting boron ions 65, as illustrated in FIG. 11. The resulting boron concentration is insufficient to over-dope the exposed source region area at the window 18a. Typically, this doping concentration may be, for example, about $10^{19}$ boron atoms cm$^{-3}$.

As illustrated FIGS. 10 and 11, the thin oxide 50 is present at the implantation window 18. A short dip etch may now be used to remove this oxide layer 50 and so open the window 18a as the contact window for the source electrode 33. Even with a very short etch, some isotropic etch-back of the oxide layer 18 will occur (both vertically and laterally) during this removal of the oxide layer 50. This etching at this stage may even be prolonged to effect the etch-back of the overlayer 18 as illustrated by broken lines 18c in FIG. 10. Thereby a wider contact area between the source region 13 and electrode 33 can be achieved. Whether such an etch-back is carried out now or before the FIG. 10 implant is a variable design option in the technology. If it is effected before the FIG. 10 implant 61, then its effect on the implanted profile of the channel-accommodating region 15 needs to be considered.

Figure 12:
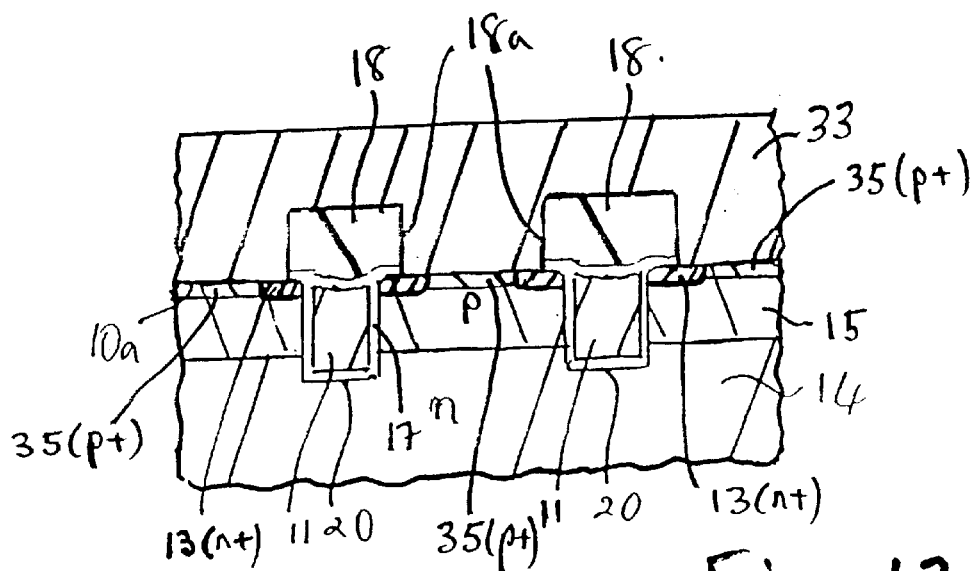

Then, as illustrated in FIG. 12, the source electrode 33 is deposited to contact both the source region 13 and the contact region 35 at the contact window 18a and to extend over the insulating overlayer 18 over the trench-gate 11. Typically, it comprises a thick layer of aluminium on a silicide contact layer. Its layout is defined (by known photolithographic and etching techniques) into separate metallization areas that form the source electrode 33 and also a gate bondpad that is connected to the trench-gate 11. The gate bondpad metallization and its connection are outside the plane of the FIG. 11 drawing. The back surface 10b is then metallized to form the drain electrode 34, after which the wafer body 100 is divided into the individual device bodies 10.

It will be evident that many modifications and variations are possible within the scope of the present invention. Considerable flexibility is possible in the specific technologies that can be used in and between stages (a) to (d) of the method (for forming spacers 52, a narrow trench 20, trench-gate 11, source region 13, the insulating overlayer 18 and the channel-accommodating region 15) and in the formation of other parts of the device. Thus, further novel features (as well as many features in the prior art) may be used in conjunction with the present invention.

Figure 5:
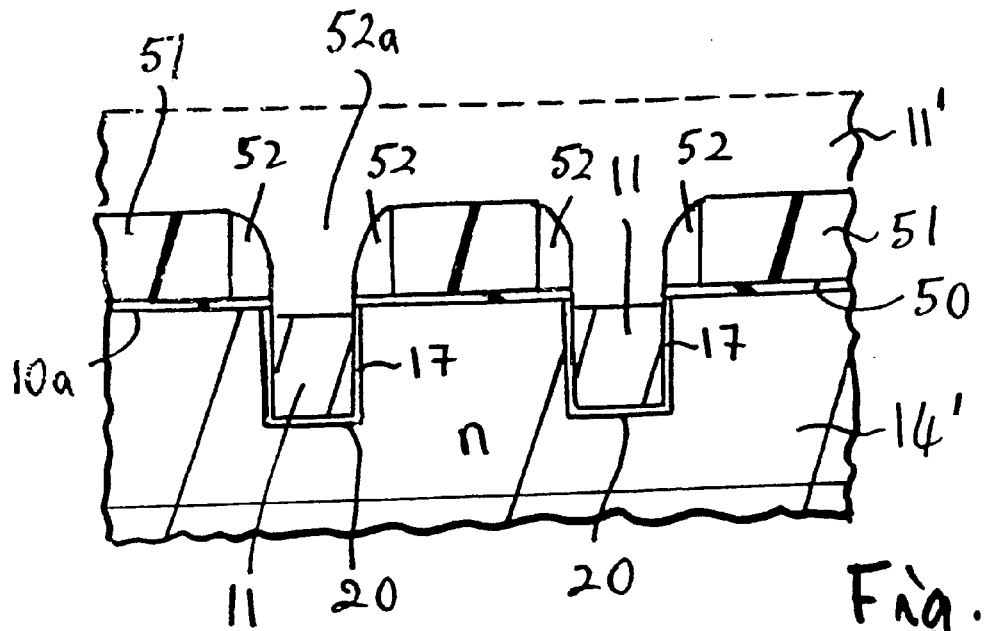

By way of example, FIG. 5 illustrates the etch-back of the gate material 11' stopping slightly below the body surface 10a. In this case, the insulating overlayer 18 of FIG. 1 extends slightly into the upper part of the trench 20, as well as laterally over the adjacent area of the surface 10a. This configuration for the overlayer 18 is particularly advantageous in providing very reliable protection against an undesirable short-circuit at the top corner of the gate trench 20, as illustrated in the enlarged view of FIG. 13.

Figure 13:
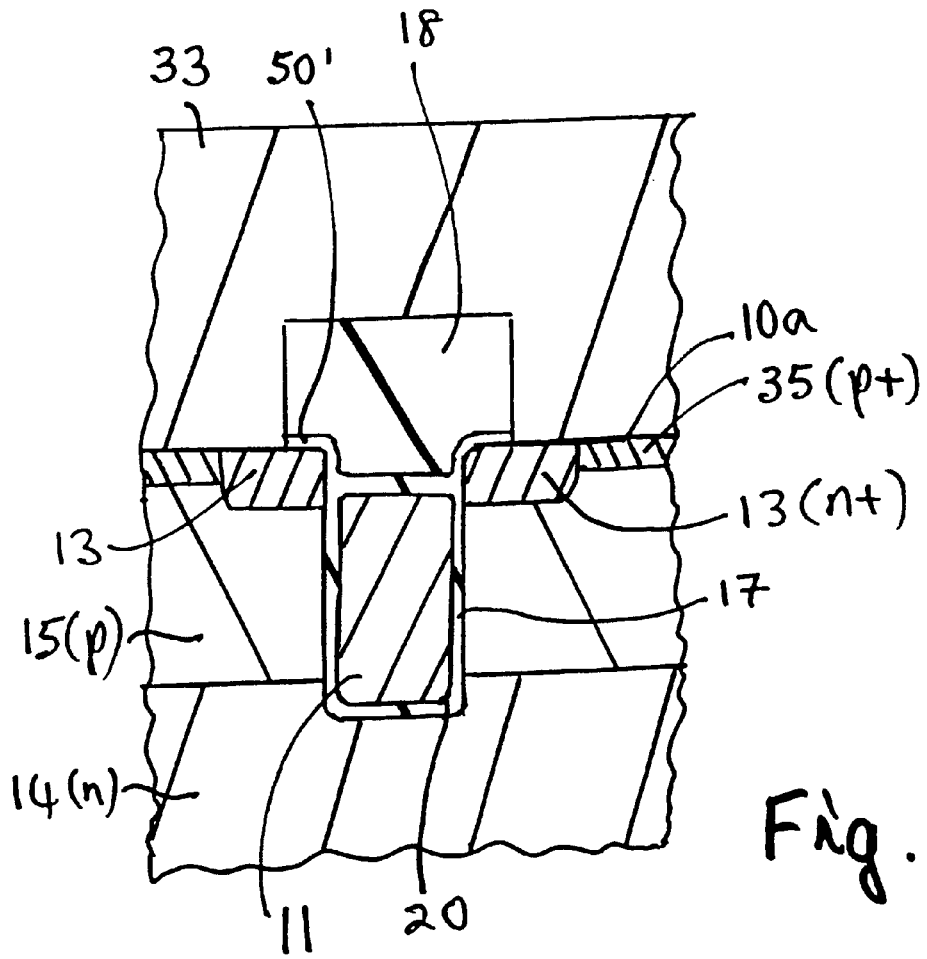
FIG. 13 is a enlarged cross-sectional view of a specific example of the insulated gate trench structure of a trench-gate semiconductor device manufactured in accordance with the invention.

Thus, during exposure to various process stages after the provision of the gate dielectric 17, some erosion of the gate dielectric 17 may occur at the top corner of the gate trench 20. This erosion may risk forming an undesirable short-circuit in the final device, between the gate 11 and the source region 13 and/or source electrode 33. However, as illustrated in FIG. 13, the deposited and etched-back oxide material 18 is left to form an insulating plug in the upper part of the trench 20 and extends laterally from the trench 20 as an insulating cap at the trench-edge of the source region 13. This combined plug and cap configuration of the overlayer 18 provides very reliable insulation of the top corner of the gate trench 20 and so protects against such a short-circuit.

However, the etch-back of the gate material 11' may be stopped coincident with the level of the body surface 10a or even when slightly higher than the body surface 10a. In the latter case, the trench-gate 11 will also protrude slightly above the level of the body surface 10a, and the overlayer 18 will extend (in the space vacated by the spacers 52) up and over the protruding trench-gate 11 instead of down into the trench 20.

In the specific embodiments described so far with reference to FIGS. 1 to 13, the mask 51 and spacer 52 are each composed of a respective single material (silicon nitride; silicon oxide). Other embodiments are possible in which composite layers of different materials are used. Thus, for example, a thick composite mask 51 may be used at an early stage in the process, after which the mask 51 may be thinned by removal of an upper part. The pending PCT patent application EP01/09330 (and corresponding U.S. patent application Ser. No. 09/932073 and GB patent applications 0020126.9 & 0101690.6; our ref: PHNL010059) disclose the use of composite sidewall spacers. In particular, there is disclosed a trench-etch mask (51) of oxide, whose windows are narrowed by composite sidewall spacers (52) that comprise polysilicon on a thin layer of silicon nitride.

Figure 14:
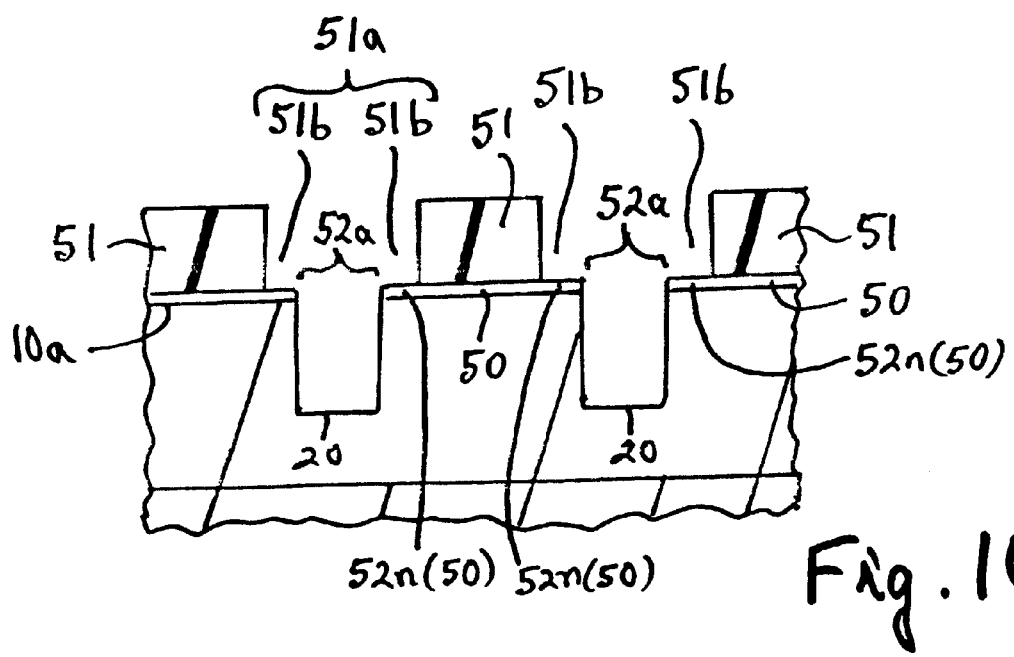
FIG. 14 is a cross-sectional view of an active central part of a trench-gate semiconductor device corresponding to that of FIGS. 2 to 12, but at the trench-etch stage in a modified method of manufacture in accordance with the invention.

In a modified embodiment of the present invention, the mask 51 may be of silicon nitride and the spacers 52 may be a composite of polysilicon on a thin nitride layer (50'). A further modification is possible in which oxide is used instead of nitride. Thus, the spacers may be a composite formed by contour-depositing a polysilicon material 52' on a thin layer 50'. In this case, when the trench 20 is etched into the body region 14' as illustrated in FIG. 14, the etching also removes the polysilicon part (52m, not shown) of the spacers 52. The resulting structure is illustrated in FIG. 14. The narrowed trench-etch window 52a remains defined by thin layer 50' (i.e. the lower spacer part 52n). Then the gate dielectric 17, gate 11, and regions 13 and 15 are provided as already described. The wider window 51a formed by the removal of the upper spacer parts 52m is used for providing the insulating overlayer 18 on the gate 11 in accordance with the present invention.

In terms of the specific embodiments so far described with an original mask 51 wholly of silicon nitride, it is noted that oxy-nitride is formed at its surface when exposed to oxidising environments as the manufacturing process sequence progresses. Thus, for example, at the stages of FIG. 5 and/or FIGS. 8, the nitride mask 51 may include a skin of oxy-nitride that is etched away when the oxide spacers 52 and/or oxide material 18' are etched, so thinning the mask 51 at these stages. This might introduce some uncertainty in thickness of the mask part 51 that remains for the implantation stage of FIG. 7 and the oxide planarization stage of FIG. 9. Furthermore, the use of thick silicon nitride for the mask 51 strains and bows the silicon wafer body 100 during manufacture.

Figure 15:
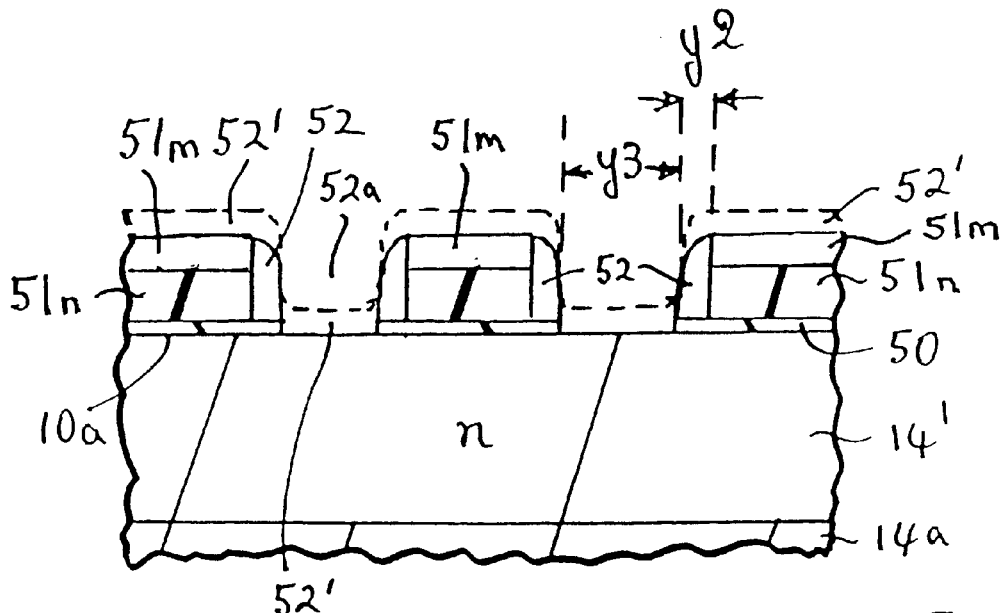
FIGS. 15 and 16 are cross-sectional view of a corresponding active central part of a trench-gate semiconductor device at the FIGS. 4 and 9 stages in a modified method of manufacture in accordance with the invention.

These disadvantages can be avoided by forming the first mask 51 in stage (a) as a composite comprising an upper layer part 51m on a lower layer part 51n. The upper layer part 51m is of a different material (e.g. of oxide) to the lower layer part 51n (typically nitride) so as to etchable from the lower layer part 51n. Such a composite mask 51m,51n is illustrated in FIG. 15 as a modification of FIG. 4. The upper layer part 51m may be etched away from the lower layer part 51n either before or after implanting the dopant ions 63 for the source region 63. By removing the upper part 51m, only the lower layer part 51n of the mask 51 serves to define the deposited and etched-back insulating overlayer 18 in stage (d), as illustrated in FIG. 16. The reduced thickness of the nitride layer 51n (as compared with a thick nitride layer 51) causes less strain on the silicon wafer body 100, and so less bowing of the wafer body 100 during manufacture.

In the embodiment of FIG. 10, the dopant ions 61 implanted for the channel-accommodating region 15 are of such a high energy as to scatter below the overlayer 18 and even possibly to penetrate the overlayer 18. As such, the desired doping profile for the channel-accommodating region 15 is implanted, without a long drive-in diffusion. However, a drive-in diffusion may be used for some devices, particularly for those with much larger cell pitch Yc and/or particularly when a lower energy implant of dopant 61 is used.

In the embodiments of FIGS. 1 to 12, the source region 13 is formed most conveniently by implanting dopant ions 63 at the doping windows 51b formed by removing the spacers 52. However, the spacers 52 may be used in other ways to provide self-alignment of the source region with the trench-gate.

In one such alternative way, the source region 13 may be diffused into the body 100 from an arsenic or phosphorus doping in the spacers 52 themselves or even in a part of the overlayer 18.

In another alternative way, the source region 13 may be formed from an n-type layer 13' at the surface 10a. This can be achieved by providing the doped layer 13' before the mask 51, and by etching through the layer 13' to the underlying region 15 while using the lateral extension y4 or y4' of the overlayer 18 on the surface 10a as an etchant mask. This lateral extension of the overlayer 18 is determined by the spacers 52. This etch definition of the source region 13 may be carried out before etching back the overlayer 18 as illustrated by the broken lines 18c in FIG. 10.

FIGS. 17 and 18 illustrate such an etch definition of the source region 13, together with a further modification that provides additional source-region stripes extending across the transistor cells. Thus, in the modified embodiment of FIGS. 17 and 18, the cells are of elongate stripe geometry. The respective source region 13 of each cell is a composite structure comprising self-aligned portions 13a that extend along the sidewalls of the gate trenches 20 and transverse portions 13b that extend transverse to the gate trenches 20. The lateral extent of the self-aligned portions 13a is defined by the lateral extension y4 or y4' of the overlayer 18, and hence by the spacers 52. The lateral extent of the transverse portions 13b is defined by an additional mask 83 comprising stripes (for example of photoresist) that extend transverse to the gate trenches 20, i.e. their alignment with respect to the narrow trenches 20 is non-critical. It is also possible to form a composite source region structure 13a,13b by implantation rather than etch definition. Thus, after forming the self-aligned portions 13a in the FIG. 7 stage, a further source implant may be carried out at, for example, the FIG. 10 stage, at windows between the stripes of a mask 83' across the elongate stripe shaped cells.

In a further alternative form, the source dopant 63 may be implanted at the windows 51a at the FIG. 3 stage, so providing an initial source region 13' at the whole of this window 51a before forming the spacers 52. Thereafter, the layer 52' is deposited, the spacers 52 are formed as in FIG. 4, and then the trench 20 is etched at the narrow window 52a as in FIG. 5. In this case, the trench 20 is etched through the initial region 13' and into the body portion 14'. The parts of the region 13' that remain below the spacers 52 form the source region 13 self-aligned with the trench 20. This process sequence for forming the source region 13 is less advantageous than that of FIG. 7, because the highly-doped implanted region 13' typically etches slightly faster than the body portion 14' so widening the upper part of the trench 20.

Instead of forming the drain-drift region 14 by an epitaxial layer on a higher-doped substrate 14a, the higher doped region 14a of some devices may be formed by dopant diffusion into the back surface 10b of a high-resistivity substrate that provides the drift region 14. The devices so far described are MOSFETs in which the higher-doped substrate 14a or region 14a is of the same conductivity type (n-type in this example) as the drain drift region 14. However, the higher-doped substrate 14a or region 14a may be of opposite conductivity type (p-type in this example) to provide an IGBT. The electrode 34 is called an anode electrode in the case of an IGBT.

A vertical discrete device has been illustrated with reference to FIG. 1, having its second main electrode 34 contacting the substrate or other region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 34 at the front major surface 10a, via a doped peripheral contact region which extends from the surface 10a to the depth of the buried layer.

The conductive gate 11 may be formed of doped polycrystalline silicon as described above. However, other known gate technologies may be used in particular devices. Thus, for example, other materials may be used for the gate, such as a metal silicide. Alternatively, the whole gate 11 may be of a refractory metal instead of polycrystalline silicon.

In the embodiments of FIGS. 1 to 18, the gate dielectric layer 17 lines the bottom as well as the sidewalls of the trench 20. However, other embodiments are possible in which the trench 20 is slightly deeper and has thick insulating material 17b in its bottom. The thick insulator 17b at the bottom of the trench 20 reduces the gate-drain capacitance of the device. Such an embodiment is illustrated in FIGS. 19 to 21.

In this case, the slightly-deeper trench 20 is etched at the narrow window 52a defined by oxide spacers 52. Thereafter, insulating material 17b' is deposited to a sufficient thickness to fill the trench 20 and to extend above the trench 20 and over the spacers 52 and mask 51. The material 17b' may be, for example, silicon dioxide. This stage is illustrated in FIG. 19.

The material 17b' is then etched back until it is left in only the lower part of the trench 20 to form the thick insulator 17b. This etch-back also removes the oxide spacers 52 and so re-exposes the wider window 51a. Thereafter, the thin gate-dielectric layer 17 is provided at the exposed sidewalls of the trench 20 and also at the surface 10a where the oxide layer 50 was removed together with the spacers 52. The resulting structure is illustrated in FIG. 20.

Gate material 11' is then deposited to fill the wide window 51a and the trench 20 therein and extends on the mask 51. The gate material 11' is then etched back to be left as the gate 11 in the trench 20, as illustrated in FIG. 21. In this case, as illustrated in FIGS. 20 and 21, the spacers 52 are removed to define the window 52b before the gate 11 is provided in the trench 20. Thus, the structure of FIG. 21 can be compared with that of FIG. 14. After the FIG. 21 stage, the regions 13 and 15 are formed by dopant implantations 61 and 63 as in FIGS. 7 and 10, followed by subsequent processing as illustrated in, for example, FIGS. 11 and 12.

Although thermal oxides are preferred for a high-quality gate-dielectric layer, the layer 17 could be deposited.

The particular examples described above are n-channel devices, in which the regions 13 and 14 are of n-type conductivity, the regions 15 and 35 are of p-type, and an electron inversion channel 12 is induced in the region 15 by the gate 11. By using opposite conductivity type dopants, a p-channel device can be manufactured by a method in accordance with the invention. In this case, the regions 13 and 14 are of p-type conductivity, the regions 15 and 35 are of n-type, and a hole inversion channel 12 is induced in the region 15 by the gate 11.

Semiconductor materials other than silicon may be used for devices in accordance with the invention, for example silicon carbide.

The drawing Figures illustrate the usual, preferred situation of an insulated gate structure, in which the conductive gate 11 is capacitively coupled to the channel-accommodating region 15 by a dielectric layer 17. However, so-called Schottky gate technologies may alternatively be used for some devices, particularly accumulation-mode devices in which the channel-accommodating body region 15 is of the same conductivity type as the high-doped source and drain regions 13 and 14. In this case, a gate dielectric layer 17 is absent, and the conductive gate 11 is of a metal that forms a Schottky barrier with the low-doped channel-accommodating portion of the region 15. The Schottky gate 11 is capacitively coupled to the channel-accommodating region 15 by the depletion layer present at the Schottky barrier.

From reading the present disclosure, other variations and modifications will be apparent to persons skilled in the art. Such variations and modifications may involve equivalent and other features which are already known in the art and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

Thus, regardless of how the overlayer 18 is provided and used, there is provided a novel method (illustrated in FIGS. 19 to 21) of manufacturing an insulated trench-gate semiconductor device, wherein:

(a) a narrow window is defined by providing sidewall extensions at the sidewalls of a wider window in a first mask at a surface of a semiconductor body, (b) a trench is etched into the body at the narrow window, (c) the trench is lined with insulating material on which the gate is subsequently provided in the trench, (d) a source region is provided so as to be self-aligned with the trench-gate by means of the sidewall extensions, and wherein stage (c) comprises using the following sequence of steps to provide, under the gate, a first insulating material which is thicker than that provided for a gate-dielectric at the sidewalls of the trench:

depositing the first insulating material to a thickness that is sufficient to fill the trench and to extend above the trench and over the sidewall extensions and over the first mask, etching back the first insulating material to leave it at the bottom of the trench, which etching back process also removes the sidewall extensions to re-expose the wider window in the first mask part, providing a thinner gate-dielectric layer at the sidewalls of the trench, depositing gate material to fill the wider window and the insulated trench therein, and then etching back the gate material to be left as the gate over the first insulating material and adjacent to the gate-dielectric layer.

Furthermore, regardless of how the overlayer 18 is provided and used, there is provided a novel method (one embodiment of which is illustrated in FIGS. 17 and 18) of manufacturing a novel trench-gate semiconductor device having elongate stripe-shaped cells and a composite source-region structure. The elongate cells are bounded by a trench-gate (11) in a trench (20) that extends from the source region (13) through a channel-accommodating region (15) to an underlying drain region (14). The composite source-region structure comprises self-aligned portions (13a) that extend along the sidewalls of the gate trenches (20) and transverse portions (13b) that extend transverse to the gate trenches (20).

In the novel method of manufacture of this device, the lateral extent of the transverse portions (13b) is defined by a mask (83) comprising stripes (for example of photoresist) that extend transverse to the gate trenches (20). The alignment of these stripes with respect to the narrow trenches (20) is non-critical. Typically, the mask (83) may be a doping mask (for example implantation mask) or an etching mask.

The other portions (13a) of the source region are self-aligned with respect to the gate trench (20). Their lateral extent can be defined by spacers (52), which themselves define the etching of the trench into the semiconductor body at a narrowed etch-mask window (51a, 52a). One example is by doping at windows (51a and/or 51b) in the trench-etch mask (51,52), of which one embodiment is illustrated in FIG. 7. Another example is by etching using the overlayer (18) as illustrated in FIGS. 17 and 18. A further example is by doping from the spacers (52) themselves. However, a variety of other ways of forming the self-aligned portions (13a) are also possible, even in manufacturing methods that do not include any provision of spacers. Thus, for example, the self-aligned portions (13a) may be formed by lateral diffusion from a doped insulating plug in the upper part of the gate trench, or by an oblique implant at the sidewall of the upper part of the trench.

What is claimed is:

1. A method of manufacturing a trench-gate semiconductor device having a trench-gate in a trench that extends from a source region through a channel-accommodating region to a drain region, comprising:

(a) defining a narrow window by providing sidewall extensions at the sidewalls of a wider window in a first mask at a surface of a semiconductor body, (b) etching a trench into the semiconductor body at the narrow window, and providing the gate in the trench, (c) providing the source region so as to be adjacent to a sidewall of the trench, and (d) providing an insulating overlayer over the trench-gate using the following sequence of steps:

removing the sidewall extensions to leave at least a part of the first mask with the wider window at the surface of the semiconductor body, depositing insulating material to a thickness that is sufficient to fill the wider window and to extend above the wider window and on the first mask part, etching back the insulating material to leave the insulating overlayer in the wider window in the first mask part, and then removing the first mask part before providing a source electrode to contact the source region and an adjacent surface region of the semiconductor body and to extend over the insulating overlayer over the trench-gate.

2. A method according to claim 1, wherein the sequence of stages (b) and (c) are such that the source region defined in stage (c) has a doping concentration of a first conductivity type that is provided in the semiconductor body after providing the gate in the trench in stage (b).

3. A method according to claim 1, wherein the source region is provided in stage (c) in such a way as to be self-aligned with the trench-gate by means of the sidewall extensions.

4. A method according to claim 3, wherein the source region is provided after the gate, using the following sequence of steps before depositing the insulating material for the insulating overlayer:

removing the sidewall extensions to leave at least a part of the first mask with the wider window at the surface of the semiconductor body and to form within the wider window a doping window between the first mask part and the trench-gate, and introducing dopant of a first conductivity type into the semiconductor body via the wider window so as to form the source region adjacent to the trench-gate and extending laterally slightly below the first mask part.

5. A method according to claim 1, wherein the trench is etched in stage (b) through a silicon body portion that has a doping concentration of the first conductivity type that extends from the surface into an underlying area to provide a part of the drain region, and wherein a gate dielectric layer is formed by thermal oxidation of the silicon body portion at the walls of the trench.

6. A method according to claim 1, wherein a channel-accommodating region of a second conductivity type is formed adjacent to the trench-gate using the following sequence of steps:

removing the first mask part in stage (d) to form a doping window in the insulating overlayer, and introducing dopant of the second conductivity type into the semiconductor body via this doping window so as to form the channel-accommodating region at the doping window and extending laterally below the insulating overlayer to the trench.

7. A method according to claim 6, wherein the channel-accommodating region is formed by ion implantation of the dopant of the second conductivity type after stage (d), at a sufficiently high energy and in a sufficiently high dose that the dopant ions implanted at the doping window in the insulating overlayer are scattered laterally below the insulating overlayer to reach the trench.

8. A method according to claim 7, wherein the dopant ions are of boron having an implantation energy in excess of 200 keV.

9. A method according to claim 1, wherein the gate is provided in a part of the trench below the level of the surface of the semiconductor body, and the subsequently deposited and etched-back insulating material of stage (d) is left in the upper part of the trench and extends laterally from the trench into the wider window of the first mask part.

10. A method according to claim 1, wherein the first mask in stage (a) is a composite comprising an upper layer part on a lower layer part, the upper layer part is of a different material to the lower layer part so as to be etchable from the lower layer part, and the upper layer part is etched away from the lower layer part before providing the insulating overlayer in stage (d).

11. A method according to claim 10, wherein the upper layer part is of silicon dioxide, and the lower layer part is of silicon nitride.

12. A method according to claim 1, wherein, after providing the insulating overlayer in stage (d), the channel-accommodating region is contacted using the following sequence of steps:

removing the first mask part to form a contact window in the insulating overlayer, introducing dopant of the second conductivity type into the semiconductor body via the contact window so as to form a more highly doped contact region for the channel-accommodating region, and depositing the source electrode to contact the source region and the contact region at the contact window and to extend over the insulating overlayer over the trench-gate.

13. A method according to claim 1, wherein, after removing the first mask part in stage (d) and before providing the source electrode, the insulating material of the insulating overlayer is isotropically etched back a sufficient distance to increase the area of the source region not covered by the insulating overlayer.

14. A method according to claim 1, wherein the gate is provided in the trench before removing the sidewall extensions to re-expose the wider window.

15. A method according to claim 1, wherein, after etching the trench, the sidewall extensions are removed to re-expose the wider window, and then gate material is deposited to fill the wider window and the trench therein and is etched back to be left as the gate in the trench.

16. A method according to claim 15, wherein, before removing the sidewall extensions, insulating material is deposited to a sufficient thickness to fill the trench and to extend above the trench and over the sidewall extensions and on the first mask, and the sidewall extensions are then removed in an etching step that etches back this insulating material until it is left in only a lower part of the trench, after which the gate is provided in a part of the trench above this insulating material in the lower part.

17. A method according to claim 1, wherein the first mask comprises silicon nitride, the sidewall extensions comprise silicon dioxide, and the insulating overlayer comprises silicon dioxide.

18. A method according to claim 1, wherein the sidewall extensions comprise polysilicon material on a thin insulating layer, and the polysilicon material of the sidewall extensions is removed in the etching stage (b) that provides the trench.

* * * * *